United States Patent
Mizutani et al.

(10) Patent No.: US 10,108,162 B2
(45) Date of Patent: Oct. 23, 2018

(54) PROCESSING DEVICE GROUP CONTROLLER, MANUFACTURING PROCESS SYSTEM, PROCESSING DEVICE GROUP CONTROL METHOD, MANUFACTURING OPTIMIZATION SYSTEM, MANUFACTURING OPTIMIZATION DEVICE, AND MANUFACTURING OPTIMIZATION METHOD

(71) Applicant: TOKYO ELECTRON LIMITED, Tokyo (JP)

(72) Inventors: Taku Mizutani, Tokyo (JP); Ichiro Namioka, Tokyo (JP); Toshihiko Iijima, Tokyo (JP); Shigenori Todate, Tokyo (JP); Takahiro Ito, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1029 days.

(21) Appl. No.: 14/284,916

(22) Filed: May 22, 2014

(65) Prior Publication Data

US 2014/0257546 A1 Sep. 11, 2014

Related U.S. Application Data

(63) Continuation of application No. PCT/JP2012/078958, filed on Nov. 8, 2012.

(30) Foreign Application Priority Data

Nov. 25, 2011 (JP) .................................. 2011-257760
Dec. 14, 2011 (JP) .................................. 2011-273436

(51) Int. Cl.
*G05B 19/042* (2006.01)
*G05B 19/418* (2006.01)
*H01L 21/67* (2006.01)

(52) U.S. Cl.
CPC ... *G05B 19/0421* (2013.01); *G05B 19/41865* (2013.01); *H01L 21/67276* (2013.01);
(Continued)

(58) Field of Classification Search
CPC ........ H01L 21/67242; H01L 21/67276; G05B 19/4183; G05B 19/41865; G05B 19/0421;
(Continued)

(56) References Cited

U.S. PATENT DOCUMENTS 5,444,632 A * 8/1995 Kline ............... G05B 19/41865
257/E21.525
8,571,703 B2 * 10/2013 Numakura ........ H01L 21/67276
700/102

(Continued)

FOREIGN PATENT DOCUMENTS

CN 1920708 A 2/2007
JP 10-41204 A 2/1998
(Continued)

OTHER PUBLICATIONS

Next-Generation Transfer System; SEMI News, 2006, vol. 22, No. 6.
(Continued)

*Primary Examiner* — Mischita Henson
(74) *Attorney, Agent, or Firm* — Nath, Goldberg & Meyer; Jerald L. Meyer

(57) ABSTRACT

A manufacturing process system includes: a plurality of processing devices which processes workpieces, with respective equipment associated with the plurality of processing devices; a transfer device which transfers the work-
(Continued)

pieces to the plurality of processing devices; a host computer which performs creating a transfer plan including information of timings at which the workpieces are carried in and out by the transfer device and acquiring an operation schedule including information of maintenance time from the plurality of processing devices; and a processing device group controller which performs acquiring the transfer plan and the operation schedule from the host computer, comparing the transfer plan and the operation schedule of each processing device, specifying the last process before maintenance for each processing device, detecting the end timing of the specified process, and instructing each processing device to be switched to an idle state at the end timing along with the associated equipment.

15 Claims, 15 Drawing Sheets

(52) U.S. Cl.
CPC ..... *G05B 2219/2205* (2013.01); *Y02P 80/114* (2015.11); *Y02P 90/14* (2015.11); *Y02P 90/20* (2015.11); *Y02P 90/28* (2015.11); *Y02P 90/86* (2015.11)

(58) Field of Classification Search
CPC .. G05B 2219/2205; Y02P 90/14; Y02P 90/20; Y02P 90/28; Y02P 80/114
See application file for complete search history.

(56) References Cited

U.S. PATENT DOCUMENTS

| | | | |
|---|---|---|---|
| 2004/0216475 A1* | 11/2004 | Sasaki | H01L 21/67167 62/185 |
| 2005/0154823 A1* | 7/2005 | Bruner | G06F 3/0626 711/112 |
| 2009/0076648 A1* | 3/2009 | Numakura | H01L 21/67276 700/228 |

FOREIGN PATENT DOCUMENTS

| | | |
|---|---|---|
| JP | 2002-55711 A | 2/2002 |
| JP | 2003-100576 A | 4/2003 |
| JP | 2004200485 A | 7/2004 |
| JP | 2006-222264 A | 8/2006 |
| JP | 2006-230146 A | 8/2006 |
| JP | 2007088429 A | 4/2007 |
| JP | 2007242854 A | 9/2007 |
| JP | 2007-273888 A | 10/2007 |
| JP | 2008250826 A | 10/2008 |
| JP | 2009135275 A | 6/2009 |
| JP | 2011096176 A | 5/2011 |
| TW | 201135864 A | 10/2011 |

OTHER PUBLICATIONS

International Search Report for International Application No. PCT/JP2012/078958 dated Jan. 16, 2013.

* cited by examiner

FIG. 6
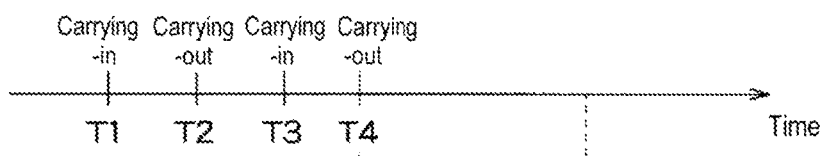
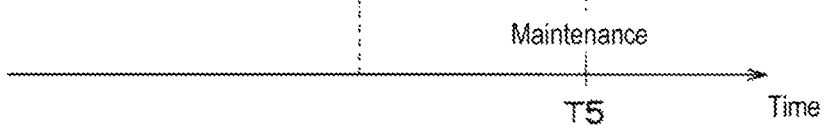

PROCESSING DEVICE GROUP CONTROLLER, MANUFACTURING PROCESS SYSTEM, PROCESSING DEVICE GROUP CONTROL METHOD, MANUFACTURING OPTIMIZATION SYSTEM, MANUFACTURING OPTIMIZATION DEVICE, AND MANUFACTURING OPTIMIZATION METHOD

CROSS-REFERENCE TO RELATED APPLICATIONS

This application is a Continuation Application of PCT International Application No. PCT/JP2012/078958, filed Nov. 8, 2012, which claimed the benefit of Japanese Patent Application Nos. 2011-257760, filed on Nov. 25, 2011; and 2011-273436, filed on Dec. 14, 2011, the entire contents of which are incorporated by reference herein.

TECHNICAL FIELD

The present disclosure relates to a processing device group controller for reducing energy consumption of equipment associated with processing devices for processing workpieces, a manufacturing process system and a processing device group control method. The present disclosure also relates to a manufacturing optimization system for efficiently managing energy consumed by processing devices for processing workpieces, a manufacturing optimization device and a manufacturing optimization method.

BACKGROUND

In a manufacturing plant with a job-shop type production system (for example, a semiconductor device manufacturing plant or an organic EL device manufacturing plant), production is controlled by an MES (Manufacturing Execution System). In such a manufacturing plant, a manufacturing process system is utilized, which includes a plurality of processing devices for processing workpieces, a transfer device for transferring the workpieces to each processing device, a transfer control device for controlling an operation of the transfer device, and a MES for determining a processing device to process the workpieces, informing the transfer control device of a transfer destination of the workpieces and informing the processing device of the procedure for processing the workpieces.

Software may be used which includes a procedure of communicating with a plurality of processing devices processing workpieces, a procedure of communicating with a transfer device transferring the workpieces between processing devices, and a procedure of communicating with a manufacturing instruction device instructing the processing devices to process the workpieces.

A plant MES and a MCS (Material Control System) may be used to control an OHT (Overhead Hoist Transport) based on various instructions received from the MES, share information such as plant layouts and so on, in order to achieve an efficient transfer.

A process management system may be used which allows the processing device to process another workpiece if the time until a workpiece to be preferentially processed arrives at a processing device is sufficiently long and that if the time until the workpiece to be preferentially processed arrives at the processing device is short, the processing device waits for the arrival of the workpiece to be preferentially processed.

A power supply system may be used in which the arrival time needed for an arrival of a workpiece to be processed is compared to a drive time of the processing device in a power saving state. If the arrival time is longer than the drive time, the processing device remains in the power saving mode.

In addition, there is known a manufacturing system in which, if a processing device in a ready state (a standby state) does not receive a specified processing instruction from a host computer for a certain period of time, the processing device switches from the ready state to an idle state (a dormant state), in order to reduce the amount of energy consumption.

Some semiconductor manufacturing plants have a plurality of processing devices performing different processes for workpieces. These processing devices are in an idle state while no process is performed for the workpieces. Here, the idle state refers to a state where some degree of energy continues to be consumed to allow the processing devices to return to an operation state quickly, although energy consumption in this state is less than that in a normal operation state. This energy consumption in the idle state is wasteful energy which has no contribution to semiconductor device manufacturing. In fact, as the number of processing devices increases, more wasteful energy is consumed.

For example, there is a technique for achieving energy saving by automatically transitioning a processing device from a normal state to an idle state if the waiting time of the processing device exceeds a predetermined period of time. However, in this proposed technique, although each processing device may be set to the idle state, it is not easy to save energy consumed in the entire semiconductor manufacturing plant since the idle state itself consumes wasteful energy, as described above.

Energy is not the only wasteful consumption in semiconductor manufacturing plants. In general, processing devices are required to keep environmental conditions, such as temperature, humidity, a degree of vacuum, a supply or discharge gas flow rate and so on within a chamber, constant in order to process workpieces within the chamber. Once the environmental conditions are greatly varied, it may take some time to return the processing devices to the original environmental conditions. Therefore, in the idle state the environmental conditions are not extremely varied, and accordingly, the resources and costs required for maintaining the environmental conditions are continually consumed wastefully.

From this background, a technique has been developed for switching the operation mode while considering recovery time required for a processing device switching the operation mode. In addition, different types of energy saving modes having different amounts of energy consumption are provided to achieve energy saving as much as possible within a range not affecting the processing by the processing devices.

An operation mode switching can be performed in consideration of the recovery time for switching of the operation mode of the processing device. However, if the operation mode is necessarily switched when the standby time of the processing device is longer than the recovery time, the operation mode may be frequently switched, which is likely to impose a burden on a power supply and so on of the processing device. In addition, in some cases, workpieces may require high precision for processing the quality of film thickness, film quality and so on. In this case, even if the standby time is longer than the recovery time, it is preferable not to switch the operation mode.

Although the switching of the operation mode is performed based on a balance with the recovery time, there is no know technique on switching of the operation mode under specified conditions other than recovery time. Thus, there is no guarantee that there will be optimal switching of the operation mode.

In addition, although the switching of the operation mode of the processing device based on the balance with the transfer timing is known, there is no known technique which considers switching of the operation mode based on the length of the standby time of the processing device.

In addition, it is known that when a predetermined time elapses from a state where the processing device is set to the normal mode, the normal mode is automatically transitioned to the energy saving mode. This transition means that the processing device is operated in the normal mode until the predetermined time elapses, i.e., meaning wasteful power consumption for at least this period.

Although various ways to achieve energy saving as described above are known, there is room for reduction of energy consumption. In addition, no way has been proposed to achieve optimal energy saving associated with certain types of workpieces.

In many cases, from the standpoint of consumption of mass energy, semiconductor manufacturing plants may make special contracts related to limitations on energy use with power companies. In such types of contracts, a level of the maximal energy consumption in the semiconductor manufacturing plants is set and the use of energy is permitted only within a range which does not exceed this level.

However, in the prior art, there exists no proper structure for scheduling a plurality of processing devices to consume the optimal amount of energy within a range of maximum energy consumption. As a result, there is a possibility to use less energy with a margin, or conversely, there may be some instability in the energy supplied from power companies due to the excessive level of maximal energy consumption.

In addition, in conventional systems, it takes some time for a processing device to be switched from a ready state to an idle state. Since an equipment associated with the processing device is switched from a ready state to an idle state after the processing device is set to the idle state, the equipment takes more time to be switched to the idle state. Thus, it becomes difficult to reduce energy consumption in the equipment.

SUMMARY

The present disclosure provides some embodiments of a processing device group controller which is capable of reducing energy consumption in equipment associated with a plurality of processing devices processing workpieces by properly switching between a ready state and an idle state of the equipment, a manufacturing process system and a processing device group control method. The present disclosure also provides some embodiments of a manufacturing optimization system, a manufacturing optimization device and a manufacturing optimization method, the manufacturing optimization system being capable of achieving the optimal energy saving in consideration of the type and processing procedures of workpieces without deteriorating the processing performance of processing devices.

According to one embodiment of the present invention, there is provided a processing device group controller including: a storage unit which stores an operation schedule including information of maintenance time for a plurality of processing devices for processing workpieces, with respective equipment associated with the plurality of processing devices, and a transfer plan including information of timings at which the workpieces are carried in and out of the plurality of processing devices; a detecting unit which performs a step of comparing the transfer plan and the operation schedule of each processing device, a step of specifying the last process before maintenance for each processing device, and a step of detecting the end timing of the specified process; and an instruction unit which instructs each processing device to be switched to an idle state at the end timing along with the associated equipment.

According to another embodiment of the present invention, there is provided a manufacturing process system including: a plurality of processing devices which processes workpieces, with respective equipment associated with the plurality of processing devices; a transfer device which transfers the workpieces to the plurality of processing devices; a host computer which performs a step of creating a transfer plan including information of timings at which the workpieces are carried in and out by the transfer device and a step of acquiring an operation schedule including information of maintenance time from the plurality of processing devices; and a processing device group controller which performs a step of acquiring the transfer plan and the operation schedule from the host computer, a step of comparing the transfer plan and the operation schedule of each processing device, a step of specifying the last process before maintenance for each processing device, a step of detecting the end timing of the specified process, and a step of instructing each processing device to be switched to an idle state at the end timing along with the associated equipment.

According to another embodiment of the present invention, there is provided a manufacturing process system including: a plurality of first processing devices which processes workpieces, with respective equipment associated with the plurality of first processing devices; a plurality of second processing devices which processes workpieces, with respective equipment associated with the plurality of second processing devices; a transfer device which transfers the workpieces to the plurality of first and second processing devices; a host computer which performs a step of creating a transfer plan including information of timings at which the workpieces are carried in and out by the transfer device and a step of acquiring an operation schedule including information of maintenance time from the plurality of first and second processing devices; a first processing device group controller which performs a step of acquiring the transfer plan and the operation schedule of the plurality of first processing devices, a step of comparing the transfer plan and the operation schedule of each first processing device, a step of specifying the last process before maintenance for each first processing device, a step of detecting the end timing of the specified process, and a step of instructing each first processing device to be switched to an idle state at the end timing along with the associated equipment; a second processing device group controller which performs a step of acquiring the transfer plan and the operation schedule of the plurality of second processing devices, a step of comparing the transfer plan and the operation schedule of each second processing device, a step of specifying the last process before maintenance for each second processing device, a step of detecting the end timing of the specified process, and a step of instructing each second processing device to be switched to an idle state at the end timing along with the associated equipment; and an upper-level controller which performs a step of acquiring the transfer plan and the operation schedules of the plurality of first and second processing devices from the host computer, a step of transmitting the transfer plan and the operation schedule of the plurality of first processing devices to the first processing device group controller, and a step of transmitting the transfer plan and the operation schedule of the plurality of second processing devices to the second processing device group controller.

According to another embodiment of the present invention, there is provided a processing device group control method including: acquiring an operation schedule including information of maintenance time for a plurality of processing devices for processing workpieces, with respective equipment associated with the plurality of processing devices; acquiring a transfer plan including information of timings at which the workpieces are carried in and out of the plurality of processing devices; comparing the transfer plan and the operation schedule of each processing device; specifying the last process before maintenance for each processing device; detecting the end timing of the specified process; and instructing each processing device to be switched to an idle state at the end timing along with the associated equipment.

According to another embodiment of the present invention, there is provided a manufacturing optimization system including: a scheduler which creates a manufacturing plan for workpieces; a dispatcher which makes an operation instruction for a plurality of processing devices to perform a process of the workpieces, based on the manufacturing plan; and a manufacturing optimization device which creates a processing plan for the plurality of processing devices and switches an operation mode of the plurality of processing devices, based on a result of the process by the scheduler and the dispatcher, wherein the operation mode of each of the plurality of processing devices includes a standby mode consuming energy to allow the process of the workpieces to be quickly started, and a sleep mode consuming minimal energy to allow the sleep mode to be quickly transitioned to the standby mode, and the manufacturing optimization device includes: a time interval measuring unit which measures a time interval until the next process is started after each of the plurality of processing devices completes the process of the workpieces, based on the manufacturing plan of the plurality of processing devices; and an operation mode setting unit which sets a corresponding processing device to the sleep mode if the time interval measured in the time interval measuring unit exceeds predetermined base time, and sets the corresponding processing device to the standby mode if the time interval does not exceed the predetermined base time.

According to another embodiment of the present invention, there is provided a manufacturing optimization system including: a scheduler which creates a manufacturing plan for workpieces; a dispatcher which makes an operation instruction for a plurality of processing devices to perform a process of the workpieces, based on the manufacturing plan; a plurality of energy consumption managing units which are respectively provided for the plurality of processing devices and manages energy consumption of the respective processing devices; and a manufacturing optimization device which, based on the energy consumption of each processing device managed in each of the energy consumption managing units and a result of the process by the scheduler and the dispatcher, determines for each lot whether each of the plurality of processing devices processes the workpieces in such a manner that the total amount of energy consumption in the plurality of processing devices does not exceed the predetermined maximum of energy consumption, and individually adjusts a processing timing of each processing device operated in each lot in such a manner that the total amount of energy consumption in the plurality of processing devices during a process of each lot does not exceed the maximum of energy consumption.

According to the present disclosure, it is possible to reduce energy consumption in equipment associated with a plurality of processing devices processing workpieces, by detecting a transfer timing between a ready state and an idle state in accordance with a process in each processing device and properly switching between a ready state and an idle state of each processing device and an equipment associated with the processing device at a proper timing, based on a transfer plan of the workpieces and an operation schedule of the plurality of processing devices. In addition, according to the present disclosure, it is possible to achieve the optimal energy saving in processing devices in consideration of the type and processing contents of workpieces without deteriorating the processing performance of the processing devices.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view illustrating one example of a transfer plan and an operation schedule.

DETAILED DESCRIPTION

Embodiments of the inventive aspects of the present disclosure will now be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
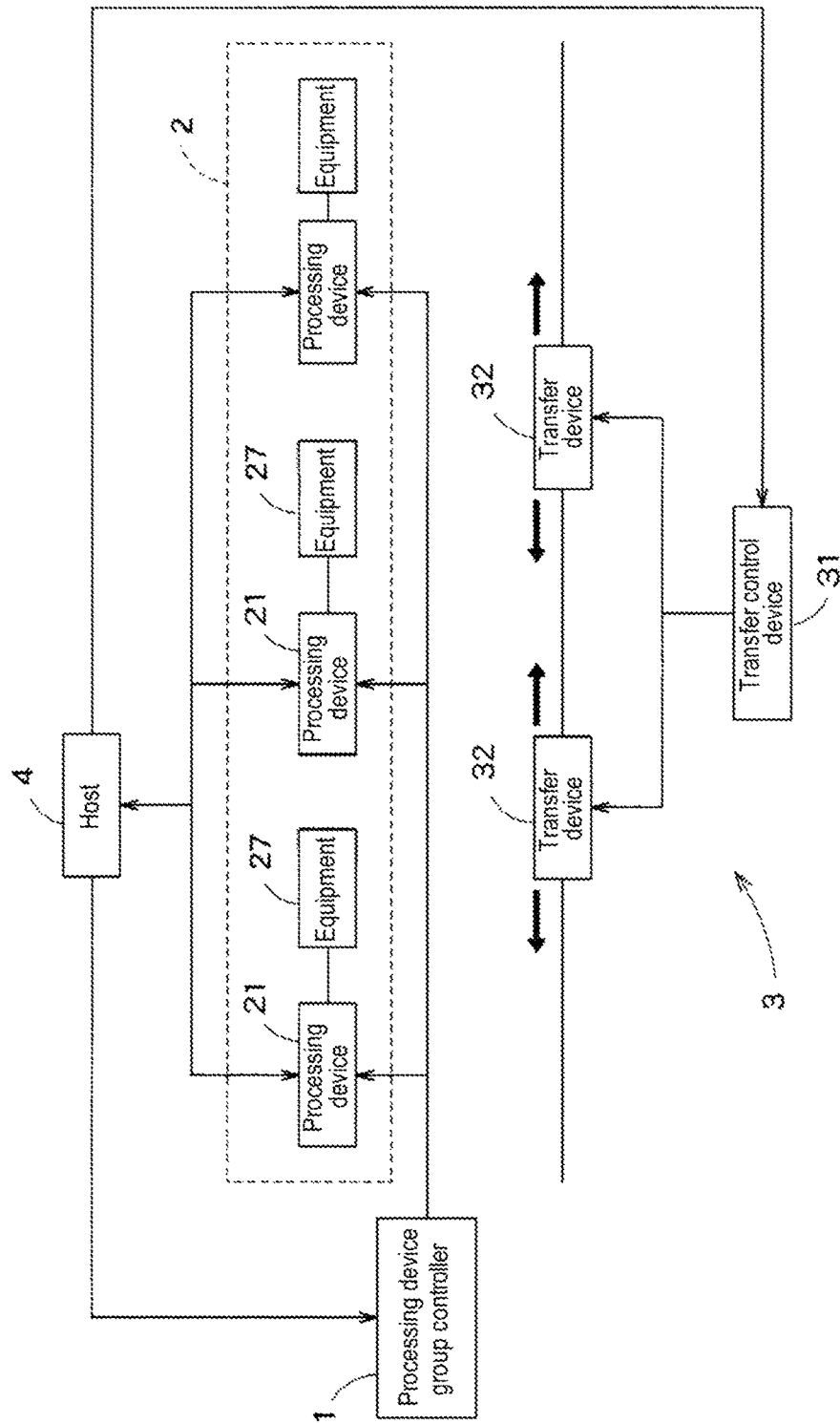
FIG. 1 is a schematic view illustrating the configuration of a manufacturing process system according to a first embodiment of the present disclosure.

FIG. 1 is a block diagram illustrating an example configuration of a manufacturing process system with a processing device group controller 1, according to a first embodiment of the present disclosure. The manufacturing process system includes a processing device group 2 including a plurality of processing devices 21, a transfer system 3 including one or more transfer devices 32 and a transfer control device 31 for controlling operation of the transfer devices 32, a manufacturing management host computer 4 (hereinafter simply referred to as a "host 4") for providing the processing device group 2 and the transfer system 3 with control instructions, and a processing device group controller 1 for instructing each processing device 21 to switch between a ready state and an idle state. As used herein, a ready state of the processing device 21 refers to a state where it is ready to start a process for a received workpiece, and an idle state refers to a dormant state.

The host 4 constitutes a so-called MES (Manufacturing Execution System). The host 4 includes a scheduler module for creating a manufacturing plan according to the type and specification of products to be manufactured. In addition, the host 4 includes a dispatcher module for specifying a processing device 21 where a workpiece is to be processed according to the created manufacturing plan and providing the processing device 21 with process conditions (recipe) on the workpiece, together with providing the transfer system 3 with a transfer plan, and so on. As used herein, a transfer plan is to specify a timing at which a workpiece is carried in the processing device 21, and/or a timing at which a workpiece processed in the processing device 21 is carried out. In addition, the host 4 receives an operation schedule (which will be described later) from each processing device 21 and transmits the transfer plan and the operation schedule of each processing device 21 to the processing device group controller 1.

The processing device 21 is a substrate processing device such as a plasma CVD device, plasma etching device, sputtering device, PVD device or the like for processing a workpiece such as, for example, a glass substrate used to manufacture an organic EL device, a silicon wafer used to manufacture a semiconductor device, or the like.

A plurality of processing devices 21 constituting one processing device group 2 may be of the same type or may correspond to a series of processing sequences.

In addition, in each processing device 21, a timing at which maintenance such as part replacement, cleaning, periodic inspection and the like is performed is set as the operation schedule. Each processing device 21 informs the host 4 of the operation schedule.

As shown in FIG. 1, the manufacturing process system is provided with equipment 27 associated with each processing device 21. Examples of the equipment 27 may include a vacuum pump for setting the internal pressure of a chamber of the processing device 21 to a desired degree of vacuum and a detoxifying device for detoxifying a gas discharged from the processing device 21.

The processing device 21 is connected to and in communication with the equipment 27 and may instruct the equipment 27 to switch between a ready state and an idle state. If the processing device 21 is instructed to switch to the idle state by the processing device group controller 1, the processing device 21 switches itself to the idle state, as well as switching the equipment 27 associated with the processing device 21 to the idle state.

The equipment 27 provided reduced energy consumption when it is put into the idle state. For example, if the equipment 27 is a vacuum pump put into the idle state, power consumption and the amount of supply of a dilution gas such as a nitrogen gas may be reduced by lowering a degree of vacuum. If the equipment 27 is a detoxifying device put into the idle state, the amount of supply of fuel used for combustion may be reduced.

Figure 2:
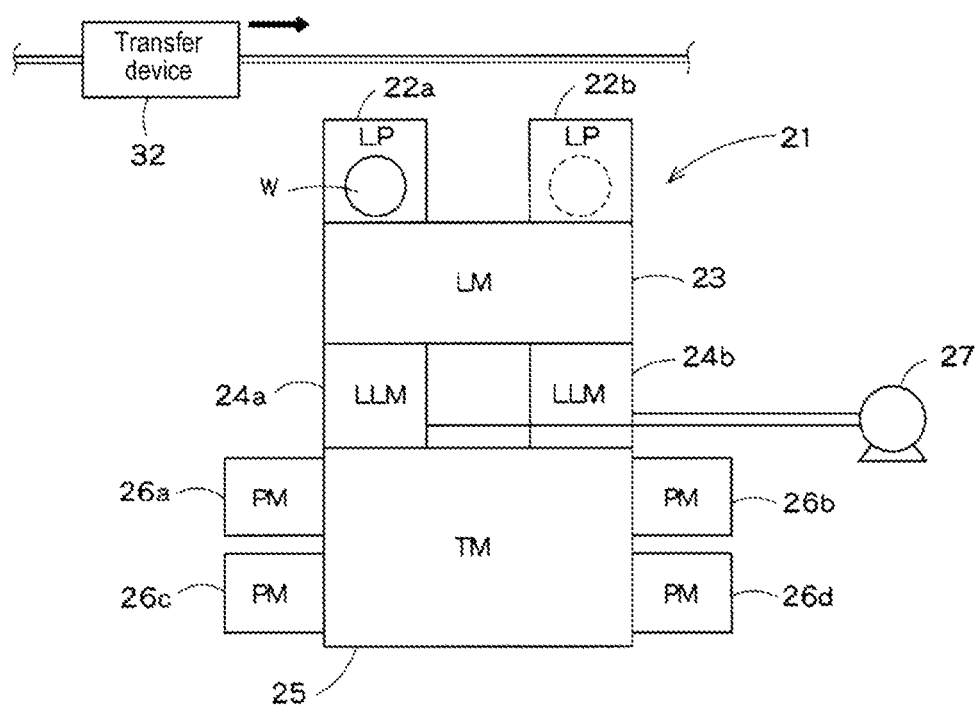
FIG. 2 is a schematic view illustrating the configuration of a processing device according to the first embodiment.

FIG. 2 is a block diagram illustrating an example configuration of the processing device 21. In this example, the processing device 21 is a multi-chamber type substrate processing system. The processing device 21 includes a LM (Load Module) 23 provided with first and second LPs (Load Ports) 22a and 22b in which FOUPs (Front Open Unified Pods) are loaded to exchange FOUPs accommodating workpieces W. A TM (Transfer Module) 25 is connected to the LM 23 via LLMs (Load Lock Modules) 24a and 24b. A vacuum robot (not shown) in the TM 25 transfers the workpieces W, which are carried in via the LLMs 24a and 24b, to PMs (Process Modules) 26a to 26d. The PMs 26a to 26d perform a predetermined process for the workpieces W based on a recipe. The processed workpieces W are collected in FOUPs loaded on the first LP 22a or the second LP 22b through a path reverse to the carrying-in of the processed workpieces W and are carried out in the FOUP.

In the multi-chamber type substrate processing system shown in FIG. 2, the PMs 26a to 26d and the TM 25 remain in a vacuum at all times, and the LLMs 24a and 24b and the TM 25 are partitioned by a gate valve (not shown). With the LLMs 24a and 24b remaining in a vacuum, the gate valve is opened and the workpieces W are transferred between the PMs 26a to 26d and the LLMs 24a and 24b. The vacuum pump as the equipment 27 makes the LLMs 24a and 24b in a vacuum.

The transfer system 3 includes a transfer control device 31 and a transfer device 32. The transfer device 32 is, for example, a transfer shuttle running on a track installed on a ceiling or floor, an automated transfer vehicle running on a predetermined route, etc., and transfers a FOUP. Based on a given instruction from the transfer control device 31, the transfer device 32 transfers workpieces accommodated in FOUPs while being moved between the plurality of processing devices 21 and a stoker storing the FOUPs.

The transfer control device 31 constitutes a so-called MCS (Material Control System) and controls operation of the transfer device 32 based on a transfer plan given by the host 4.

Figure 3:
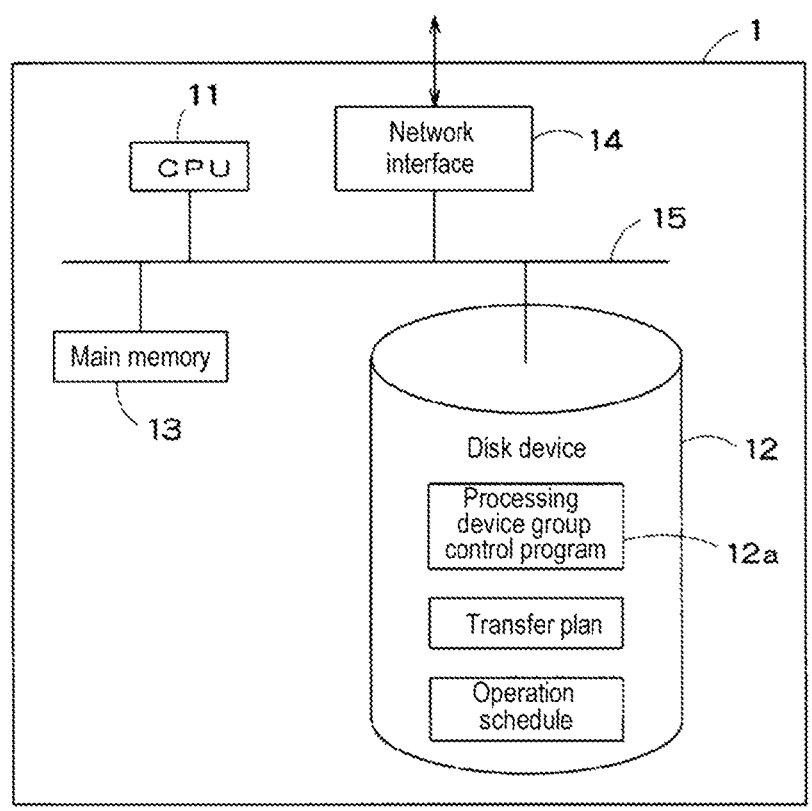
FIG. 3 is a view illustrating a hardware configuration of a processing device group controller according to the first embodiment.

FIG. 3 is a block diagram illustrating an example hardware configuration of the processing device group controller 1. The processing device group controller 1 includes a CPU (Central Processing Unit) 11, a disk device 12, a main memory 13 and a network interface 14. These components of the processing device group controller 1 are interconnected via a bus 15.

The disk device 12 stores a processing device group control program 12a to be executed by the CPU 11. The disk device 12 also receives and stores a transfer plan and an operation schedule of each processing device 21 from the host 4 via the network interface (a receiving part) 14. The disk device 12 is, for example, a hard disk. In addition, the processing device group control program 12a may be stored in a ROM or a magnetic tape (both not shown) instead of the disk device 12.

Figure 4:
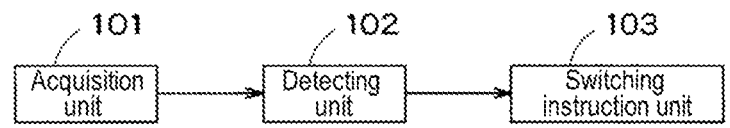
FIG. 4 is a functional block diagram of the processing device group controller according to the first embodiment.

The CPU 11 loads the processing device group control program 12a in the disk device 12 to the main memory 13 and executes the processing device group control program 12a. FIG. 4 is a functional block diagram implemented by the CPU 11 executing the processing device group control program 12a. An acquisition unit 101, a detecting unit 102 and a switching instruction unit 103 are implemented by the execution of the processing device group control program 12a.

Figure 5:
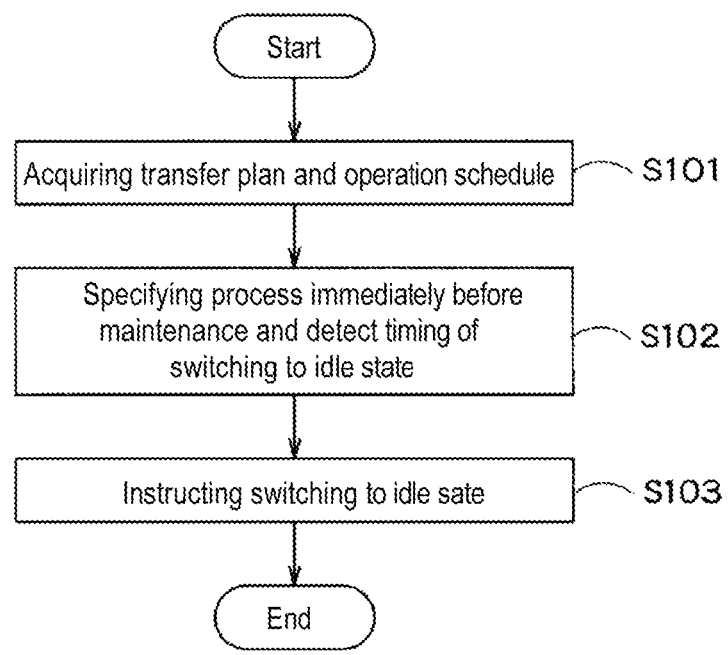
FIG. 5 is a flow chart for explaining a process of instruction of switching of a processing device to an idle state according to the first embodiment.

A process of instruction of switching to an idle state for a processing device 21, which is executed in the acquisition unit 101, the detecting unit 102 and the switching instruction unit 103, will now be described with reference to a flow chart shown in FIG. 5.

(Step S101)

The acquisition unit 101 acquires a transfer plan and an operation schedule of each processing device 21, which are stored in the disk device 12.

(Step S102)

The detecting unit 102 compares the transfer plan and the operation schedule of each processing device 21, specifies the last process before maintenance (a process immediately before maintenance), and detects a timing at which the processing device 21 is switched to the idle state.

For example, the detecting unit 102 compares a transfer plan specified with carrying-in time T1 and T3 and carrying-out time T2 and T4 of a workpiece, as shown in FIG. 6A, and an operation schedule specified with maintenance time T5, as shown in FIG. 6B. The detecting unit 102 specifies that the process of the workpiece carried in at time T3 and carried out at time T4 is the process immediately before maintenance. In addition, the detecting unit 102 detects an end timing of this process, for example, carrying-in time T4 of the workpiece, as a timing of switching to the idle state. This is because there is no need for the processing device 21 to be in a ready state between time T4 and time T5 since the workpiece is not yet carried in the processing device 21.

By ending the process immediately before maintenance, it is possible to lengthen the time for which the processing device 21 remains in the idle state, by putting the processing device 21 in the idle state.

(Step S103)

The switching instruction unit 103 sends an instruction to the processing device 21 via the network interface 14 such that the processing device 21 is switched to the idle state along with the equipment 27 associated with the processing device 21, at the timing detected in Step S102. The switching instruction unit 103 may instruct the processing device 21 to be switched at the timing detected in Step S102 or may inform the processing device 21 of a switching instruction and a switching timing before the timing detected in Step S102.

Thus, the processing device 21 and the equipment associated with the processing device 21 are quickly put into the idle state when the process immediately before maintenance is completed.

In this manner, according to this embodiment, the process immediately before maintenance is specified, and the equipment 27 is put into the idle state when this process is completed. Accordingly, as compared to a case where the processing device 21 determines switching from a ready state to an idle state when a specified processing instruction is not received from the host 4 for a certain period of time, the equipment 27 can be quickly put into the idle state and the time for which the equipment 27 is in the idle state can be lengthened. Thus, energy consumption at the equipment 27 can be reduced.

In this embodiment, the processing device group controller 1 instructs the processing device 21 to be switched to the idle state, and the processing device 21 receiving this instruction switches the associated equipment 27 to the idle state. However, the processing device group controller 1 may directly instruct the equipment 27 to be switched to the idle state.

In this embodiment, if the transfer plan is not transmitted from the host 4 for a certain period of time, that is, the network interface 14 does not receive the transfer plan for a certain period of time, the processing device group controller 1 may determine that the processing device 21 of the processing device group 2 is not scheduled to be used, and may instruct each processing device 21 to be switched to the idle state.

The processing device 21 has a function to inform the host 4 of a current operation situation in association with a change in an operation situation. The operation situation of the processing device 21 may include, for example, a run state (a state where a workpiece is being processed), a ready state and an idle state. The processing device group controller 1 may acquire an operation situation of each processing device 21 from the host 4. If the transfer plan is not transmitted from the host 4 for a certain period of time, the processing device group controller 1 may instruct each processing device 21 to be switched to the idle state, based on an operation history (a past operation situation) of each processing device 21. For example, if it is predicted from the operation history of the processing device 21 that no processing is performed for a while in the processing device 21, the processing device group controller 1 instructs the processing device 21 to be switched to the idle state.

Figure 7:
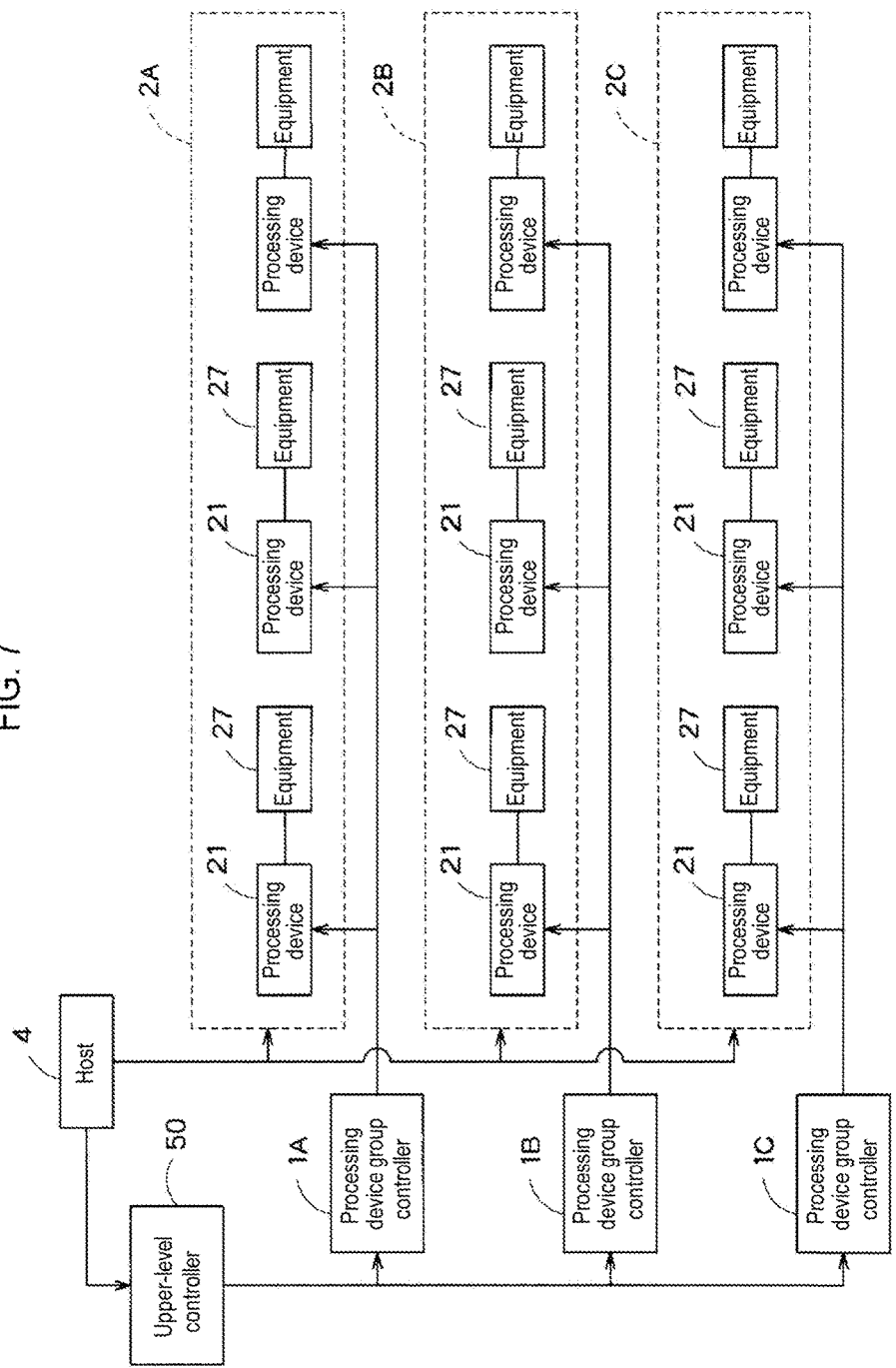
FIG. 7 is a schematic view illustrating a configuration of a manufacturing process system according to a modification.

In addition, in this embodiment, one processing device group controller 1 performs switching of the operation state of a plurality of processing devices 21 included in one processing device group 2. However, as shown in FIG. 7, a plurality of processing device group controllers 1A to 1C and processing device groups 2A to 2C may be provided, and an upper-level controller 50 for performing exchange of information between the processing device group controllers 1A to 1C and the host 4 may be provided. The transfer system 3 is not shown in FIG. 7.

For example, upon receiving operation schedules of the plurality of processing devices 21 included in the processing device groups 2A to 2C from the host 4, the upper-level controller 50 transmits the operation schedules of the plurality of processing devices 21 included in the processing device group 2A to the processing device group controller 1A. Similarly, the upper-level controller 50 transmits the operation schedules of the plurality of processing devices 21 included in the processing device group 2B to the processing device group controller 1B. In addition, the upper-level controller 50 transmits the operation schedules of the plurality of processing devices 21 included in the processing device group 2C to the processing device group controller 2C.

Figure 8:
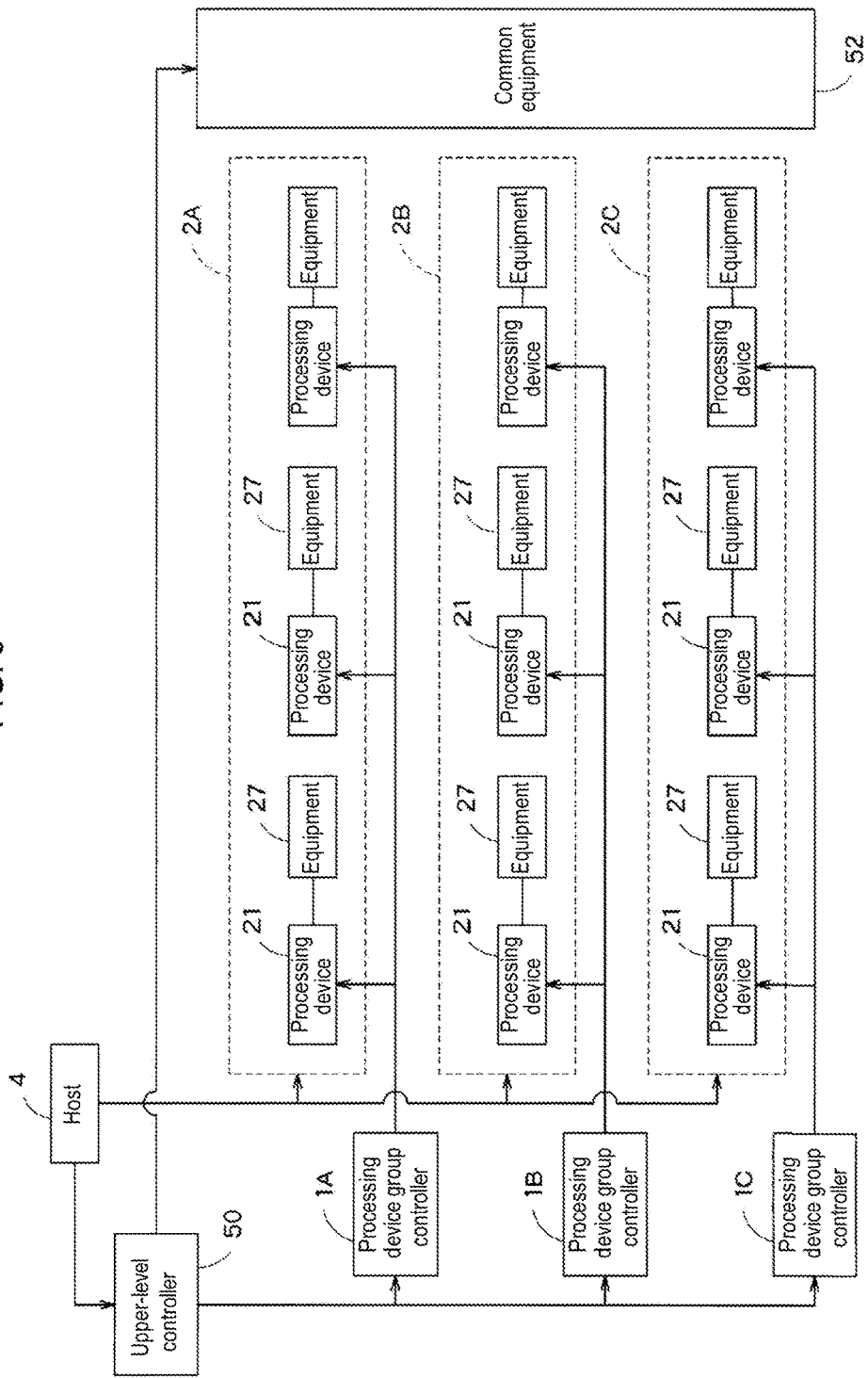
FIG. 8 is a schematic view illustrating a configuration of a manufacturing process system according to a modification.

In addition, as shown in FIG. 8, if a common equipment 52 used in common by the plurality of processing devices 21 included in the processing device groups 2A to 2C is provided, the upper-level controller 50 may perform a usage arbitration or a switching of the operation state of the common equipment 52.

For example, if an operation load of the common equipment 52 exceeds a predetermined value, the upper-level controller 50 instructs the processing device groups 2A to 2C to determine whether to use the common equipment 52, so that an excessive load is not exerted on the common equipment 52.

In addition, for example, the upper-level controller 50 compares the transfer plan and the operation schedules of the plurality of processing devices 21 included in the processing device groups 2A to 2C. Then, if all of the processing devices 21 complete the process immediately before the maintenance and wait for the maintenance, the common equipment 52 is switched to the idle state. Thus, the common equipment 52 can be efficiently and strategically used.

Figure 9:
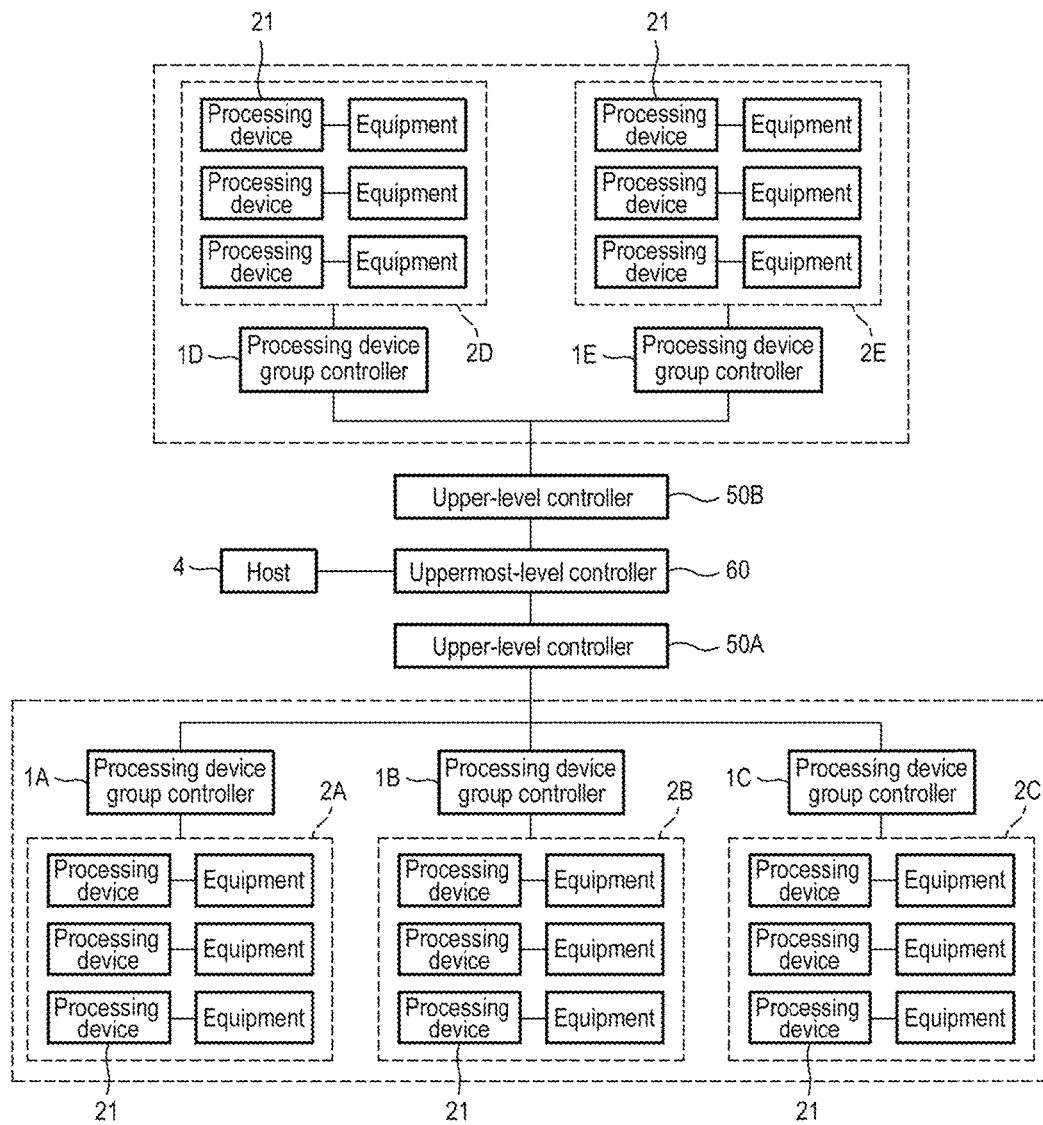
FIG. 9 is a schematic view illustrating a configuration of a manufacturing process system according to a modification.

In an example shown in FIG. 7, a two-hierarchical controller including the upper-level controller 50 and the processing device group controllers 1A to 1C is shown. However, the number of hierarchies of a controller may be 3 or more. FIG. 9 shows an example configuration of a three-hierarchical controller including an uppermost-level controller 60 communicating with the host 4, processing device group controllers 1A to 1C for performing switching of the operation state of processing devices 21 included in processing device groups 2A to 2C, processing device group controllers 1D and 1E for performing switching of the operation state of processing devices 21 included in processing device groups 2D and 2E, an upper-level controller 50A for performing exchange of information between the uppermost-level controller 60 and the processing device group controllers 1A to 1C, and an upper-level controller 50B for performing exchange of information between the uppermost-level controller 60 and the processing device group controllers 1D and 1E.

For example, by grouping a plurality of processing device groups sharing an equipment, installing the upper-level controllers 50A and 50B in association with each group and installing the uppermost-level controller 60 between a plurality of the upper-level controllers 50A and 50B and the host 4, a strategic use or a usage arbitration of the shared equipment can be performed.

At least some of the processing device group controller 1 and the host 4 described in the above embodiment may be implemented with either hardware or software. In the latter case, a program implementing at least some functions of the processing device group controller 1 and the host 4 may be stored in a recording medium such as a flexible disk, a CD-ROM or the like, which may be read and executed by a computer. The recording medium may be either a removable recording medium such as a magnetic disk, an optical disk or the like, or a fixed recording medium such as a hard disk, a memory or the like.

In addition, the program implementing at least some functions of the processing device group controller 1 and the host 4 may be distributed via a communication link (including wireless communication) such as the Internet or the like. In addition, with this program encoded, modulated or compressed, the program may be distributed via a wired link such as the Internet or the like, or a wireless link or through the program stored in a recording medium.

Second Embodiment

Figure 10:
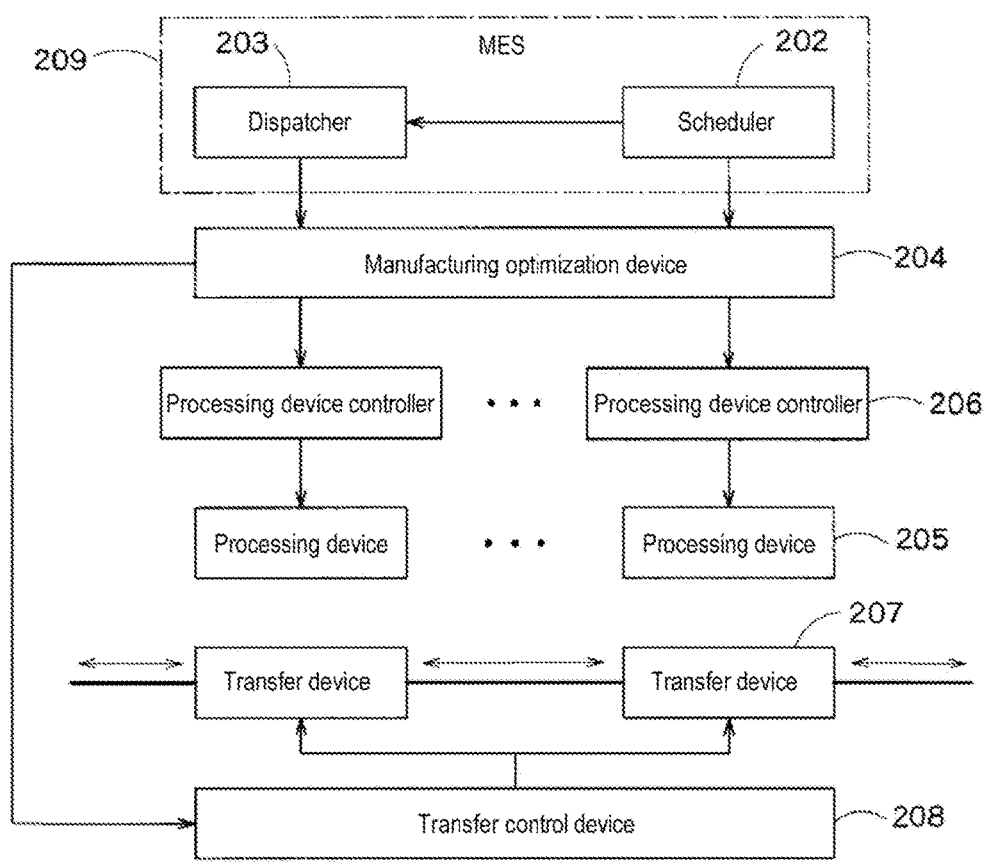
FIG. 10 is a block diagram illustrating the general configuration of a manufacturing optimization system according to a second embodiment of the present disclosure.

FIG. 10 is a schematic block diagram illustrating the configuration of a manufacturing optimization system according to a second embodiment of the present invention. A manufacturing optimization system 201 of FIG. 10 includes a scheduler 202, a dispatcher 203, a manufacturing optimization device 204, a plurality of processing devices 205, a plurality of processing device controllers 206, a plurality of transfer devices 207 and a transfer control device 208.

The scheduler 202 creates a manufacturing plan of workpieces (for example, semiconductor devices) in a manufacturing plant (for example, a semiconductor manufacturing plant). This manufacturing plan is sequentially updated based on a manufacturing progress plan.

Based on the manufacturing plan created by the scheduler 202, the dispatcher 203 makes an operation instruction for the plurality of processing devices 205 to perform the process of the workpieces.

The scheduler 202 and the dispatcher 203 constitute a MES (Manufacturing Execute System) 209 and may be, in reality, implemented by one or more computers.

Based on a result of the process in the scheduler 202 and the dispatcher 203, the manufacturing optimization device 204 creates a processing plan of the plurality of processing devices 205 and performs switching of an operation mode of the plurality of processing devices 205. In particular, the manufacturing optimization device 204 according to this embodiment performs switching of an operation mode of each processing device 205.

Here, the operation mode includes a standby mode which consumes power to start the process of the workpieces quickly, and a sleep mode which consumes as little power as possible to be quickly transitioned to the standby mode. In addition to these modes, other modes may be provided.

It is not necessary that all of the plurality of processing devices 205 can switch the operation mode, but at least some of the processing devices 205 may switch the operation mode.

The plurality of processing devices 205 are plasma CVD devices, plasma etching devices, sputtering devices, PVD devices or the like for processing workpieces such as, for example, a glass substrate used to manufacture organic EL devices, a silicon wafer used to manufacture semiconductor devices, or the like, without any limitation on specific processing contents.

In addition, the plurality of processing devices 205 may be classified into different groups performing different processes with each other, wherein two or more processing devices 205 performing the same process are treated as one group. In this case, if a processing speed is prioritized, the manufacturing optimization device 204 may select a plurality of processing devices 205 simultaneously from one group and process a plurality of workpieces simultaneously to increase a process throughput. If energy saving is prioritized, the manufacturing optimization device 204 may perform a process with a processing device 205 with the least energy consumption selected from the same group.

Alternatively, if one process is continuously performed in a plurality of processing devices 205, a plurality of groups performing the same process may be provided, by treating these processing devices 205 as one group.

A processing device controller 206 is provided to correspond to each of the plurality of processing devices 205. The processing device controller 206 controls an operation of a corresponding processing device 205 according to an instruction received from the manufacturing optimization device 204, and detects a signal from various sensors (not shown) connected to the processing device 205. The sensors are not particularly limited in type and may be used to measure, e.g., temperature, humidity, gas flow rate, degree of vacuum and so on within a chamber in the processing device 205.

A transfer device 207 is, e.g., a transfer shuttle running on a track installed on a ceiling or a floor, or an automated transfer vehicle running on a predetermined route or the like. In addition, the transfer device 207 transfers a transfer container (a carrier). Based on an instruction from the transfer control device 208, the transfer device 207 transfers workpieces accommodated in the carrier while being moved between the plurality of processing devices 205 and a stoker storing the carrier.

The transfer control device 208 constitutes a so-called MCS (Material Control System) and controls an operation of the transfer device 207 based on a transfer plan created in the scheduler 202.

Figure 11:
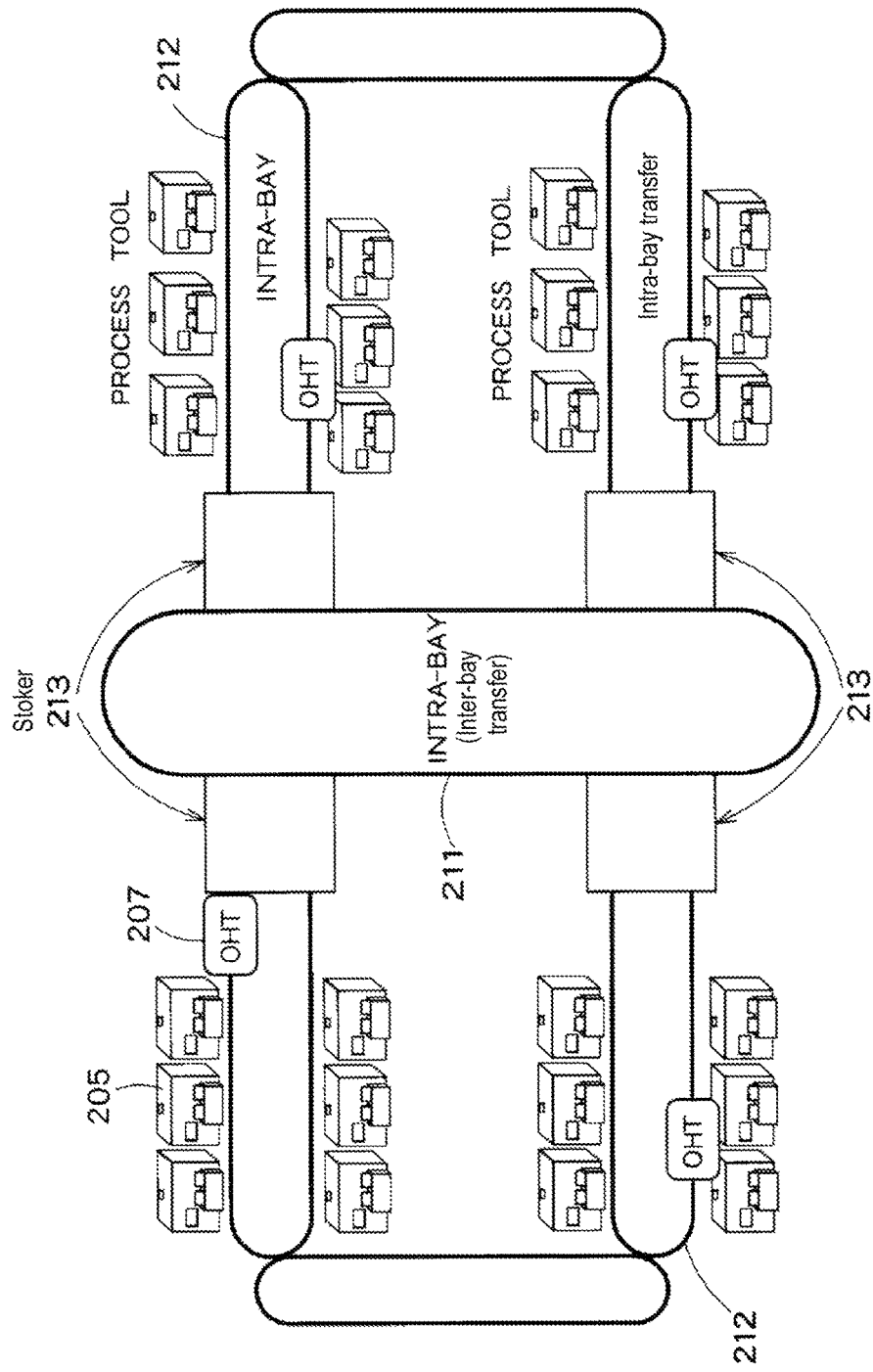
FIG. 11 is a view illustrating one example of a transfer path of a transfer device.

FIG. 11 is a view illustrating one example of a transfer path of the transfer device 207. FIG. 11 shows a transfer path of a workpiece in one process. As shown, at a central portion, an inter-bay transfer path 211 for performing a transfer between processes is provided, and intra-bay transfer paths 212 are provided at both sides of the inter-bay transfer path 211.

The left and right intra-bay transfer paths 212 have a U-like shape and the inter-bay transfer path 211 is connected to entrances of both end portions of the intra-bay transfer paths 212. Stokers 213 storing workpieces such as wafers temporarily are provided at the entrances of both end portions of the intra-bay transfer paths 212. The workpieces transferred from the inter-bay transfer path 211 are stored at first in the stokers 213, drawn out all at once at a desired timing and then transferred to the intra-bay transfer paths 212. In this manner, the stokers 213 are provided to absorb a deviation between the process completion timing in each processing device 205 and the transfer timing in the previous or the next process.

The intra-bay transfer paths 212 are U-shaped rails installed on, for example, a ceiling or a floor. A transfer device 207 (OHT: Overhead Hoist Transfer) with a hoist mechanism to be vertically moved by a belt drive runs on the rails. Upon reaching just above a processing device 205 to process a workpiece, the transfer device 207 descends in the hoist mechanism and mounts the workpiece on the processing device 205.

A plurality of processing devices 205 are arranged on both sides of the intra-bay transfer paths 212. As described above, processing devices 205 performing the same process may be arranged in proximity to one another as one group. Or, if one process is shared by the plurality of processing devices 205, the plurality of processing devices 205 may be arranged in a processing order.

Although not shown in FIG. 11, a branch path evacuating a transfer vehicle temporarily from a transfer path is provided in the vicinity of each processing device 205. Thus, if the transfer vehicle reaches a position of a processing device 205 of interest considerably before process starting time, the transfer vehicle can be evacuated to the branch path. Accordingly, a plurality of transfer vehicles can be moved at a high speed on the transfer path, without the transfer vehicles being stopped on the transfer path.

Figure 12:
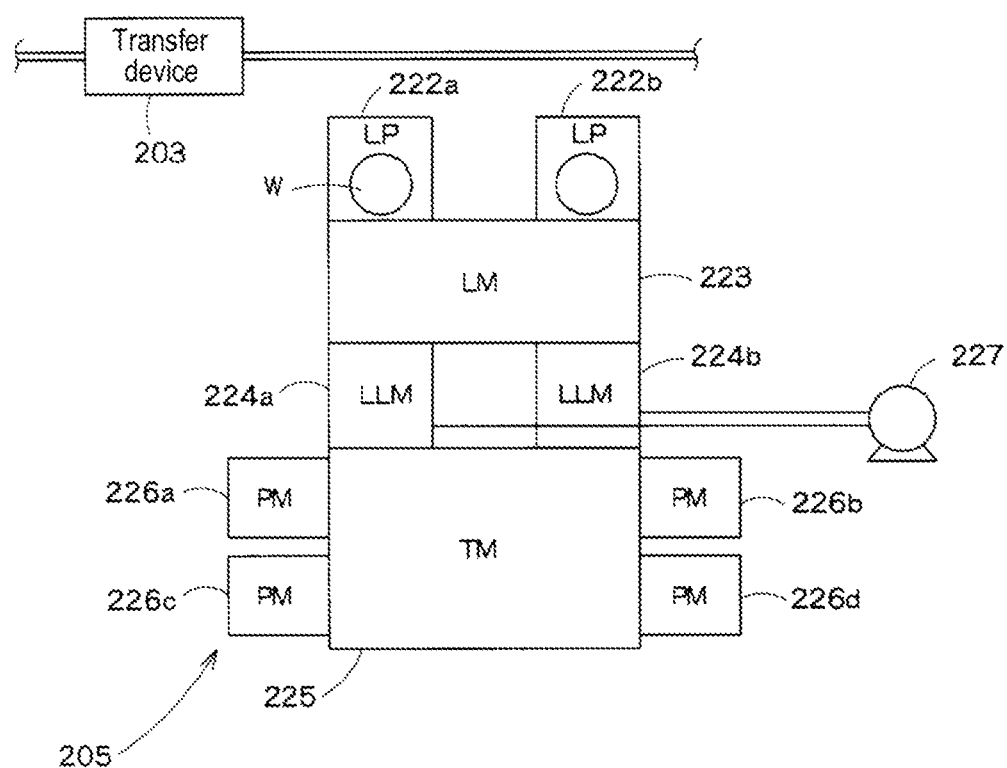
FIG. 12 is a block diagram illustrating an example configuration of a processing device.

FIG. 12 is a block diagram illustrating an example configuration of the processing device 205. The processing device 205 is, for example, a multi-chamber type substrate processing system. The processing device 205 includes a LM (Load Module) 223 provided with first and second LPs (Load Ports) 222a and 222b in which carriers (Font Open Unified Pods) are loaded to exchange carriers accommodating workpieces W. A TM (Transfer Module) 225 is connected to the LM 223 via LLMs (Load Lock Modules) 224a and 224b. A vacuum robot (not shown) in the TM 225 transfers the workpieces W, which are carried in via the LLMs 224a and 224b, to PMs (Process Modules) 226a to 226d. The PMs 226a to 226d perform a predetermined process for the workpieces W based on a recipe. The processed workpieces W are collected in the carriers loaded on the first LP 222a or the second LP 222b through a path reverse to the carrying-in of the processed workpieces W and are carried out through the carrier units.

In the multi-chamber type substrate processing system shown in FIG. 12, the PMs 226a to 226d and the TM 225 remain in a vacuum at all times, and the LLMs 224a and 224b and the TM 225 are partitioned by a gate valve (not shown). With the LLMs 224a and 224b remaining in a vacuum, the gate valve is opened and the workpieces W are transferred between the PMs 226a to 226d and the LLMs 224a and 224b. The vacuum pump makes the LLMs 224a and 224b in a vacuum.

Figure 13:
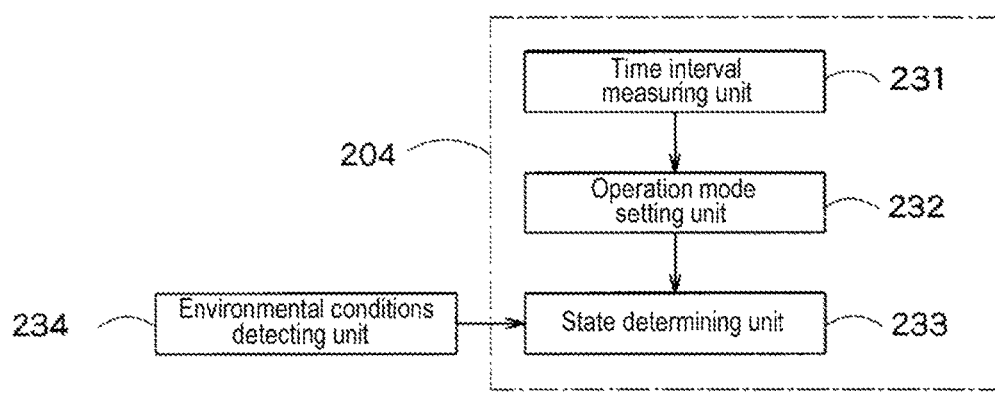
FIG. 13 is a block diagram illustrating an example internal configuration of a manufacturing optimization device according to the second embodiment.

FIG. 13 is a block diagram illustrating an example internal configuration of the manufacturing optimization device 204 according to the second embodiment. The manufacturing optimization device 204 of FIG. 13 includes a time interval measuring unit 231, an operation mode setting unit 232 and a state determining unit 233. The time interval measuring unit 231 measures a time interval until the next process is started after the processing device 205 completes the process for a workpiece. If the time interval measured in the time interval measuring unit 231 exceeds a predetermined base time, the operation mode setting unit 232 sets the processing device 205 to a sleep mode. If the time interval does not exceed the predetermined base time, the operation mode setting unit 232 sets the processing device 205 to a standby mode. Based on environmental conditions of the processing device 205, the state determining unit 233 determines whether or not the processing device 205 returned from the sleep mode to the standby mode is ready to start the process of the workpiece, which is not mandatory as described later.

The processing operation of the time interval measuring unit 231 and the operation mode setting unit 232 may be performed in either hardware or software. When the manufacturing optimization device 204 is implemented by a computer, all or some processes of the manufacturing optimization device 204 can be implemented by software by executing a program (software) to perform the processing operation of the time interval measuring unit 231 and the operation mode setting unit 232 with the computer.

Figure 14:
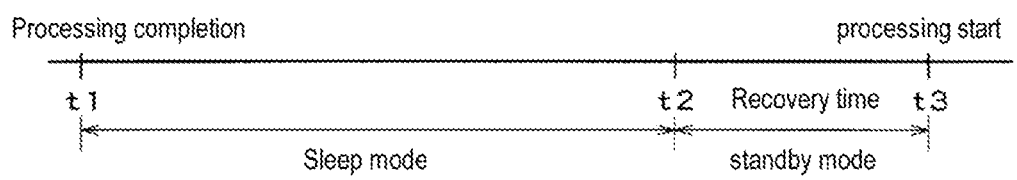
FIG. 14 is a view for explaining a method of measuring a time interval.

The time interval measuring unit 231 may measure the above-mentioned time interval in consideration of recovery time until the processing device 205 is ready to start the process, after switching the processing device 205 from the sleep mode to the standby mode. That is, as shown in FIG. 14, the time interval measuring unit 231 may measure a time interval $t2-t1$, in consideration of time $t1$ at which the processing device 205 completes the process of the workpiece, time $t3$ at which the next process is started, and time $t2$ earlier than time $t3$ by the amount of recovery time.

In this case, if the time interval t2−t1 exceeds a predetermined base time, the operation mode setting unit 232 sets the processing device 205 to the sleep mode. Otherwise, the operation mode setting unit 232 sets the processing device 205 to the standby mode.

In this manner, if the switching of the operation mode is performed in consideration of the recovery time when the processing device 205 is switched from the sleep mode to the standby mode, the process of the workpiece can be performed in a state where the processing device 205 is ready to start the process until the next process is started. Thus, this may result in improvement of processing performance.

Also, in the measurement of the time interval, the consideration of the recovery time of the processing device 205 is optional. The recovery time may be considered only if there is a significant difference in recovery time depending on the operation mode.

As described above, even if the processing device 205 is switched from the sleep mode to the standby mode, the processing device 205 cannot process the workpiece during the recovery time. Even if the recovery time is estimated in advance, it is not always accurate. The real recovery time until the processing device 205 is ready to process the workpiece may be different depending on environmental conditions (for example, temperature, humidity, degree of vacuum, gas flow rate and so on) of the processing device 205, at the time when the processing device 205 is switched from the sleep mode to the standby mode.

Accordingly, the state determining unit 233 detects environmental conditions such as temperature, humidity, gas flow rate and so on, based on a detection signal from an environmental conditions detecting unit 234 constituted by various sensors included in the processing device 205. In addition, the state determining unit 233 determines whether or not the processing device 205 is ready to perform the next process of the workpiece, based on a result of the detection. In this manner, the state determining unit 233 is provided to detect an error of the recovery time estimated in advance.

The above-described operation mode switching by the manufacturing optimization device 204 is performed for each processing device 205. If there exists a plurality of processing devices 205 performing the same process and these processing devices 205 perform the process simultaneously, a common operation mode control may be performed. If different processing devices 205 perform different processes simultaneously, the operation mode control may be performed for each processing device 205 or each processing device group performing a different process with each other.

In addition, some workpieces may require high processing precision, and even when standby time is long it may be advantageous not to change environmental conditions such as temperature, humidity and so on within a chamber at all. Accordingly, in this case, as an exceptional measure, the manufacturing optimization device 204 remains in the standby mode regardless of the length of the standby time. In this manner, the manufacturing optimization device 204 controls the operation mode based on the length of the time interval measured in the time interval measuring unit 231 and the contents of the process performed for the workpiece by the processing device 205.

In this manner, in the second embodiment, the time interval until the processing device 205 starts the next process after completing the process of the workpiece is estimated in advance, and the operation mode switching of the processing device 205 is performed depending on the length of the time interval. Thus, it is possible to achieve efficient reduction of energy consumption of the processing device 205 without frequent switching of the operation mode and deterioration of the processing performance of the processing device 205.

In addition, when the time interval is estimated, the recovery time of the processing device 205 in the operation mode switching may be considered. Thus, the processing device 205 can complete preparation for processing the workpiece until a starting time for the next process initially scheduled, thereby improving the processing performance.

In addition, it is determined whether or not the processing device 205 is ready to process the workpiece, based on the environmental conditions of the processing device 205 detected after performing the operation mode switching. Thus, the processing device 205 can process the workpiece under optimal conditions.

Third Embodiment

A third embodiment involves adjusting the total amount of energy consumption in a plurality of processing devices 205 not to exceed the maximum of energy consumption.

The general configuration of a manufacturing optimization system 201 according to a third embodiment of the present invention is illustrated by the same block diagram as FIG. 10. In this embodiment, it is assumed that the maximum energy consumption in the manufacturing optimization system 201 is predetermined by a contract with a power company, etc. Further, each processing device 205 is operated within a range that does not exceed the maximum of energy consumption.

The manufacturing optimization system 201 according to the third embodiment is based on the premise that a workpiece is processed for each lot. In one lot, a plurality of workpieces is performed in one or more processing devices 205. Herein, it is assumed that the plurality of processing devices 205 are classified as a plurality of groups, each group including two or more processing devices 205 performing the same process. In one group, a plurality of processing devices 205 belonging to the group can be used to process a plurality of workpieces in the same lot.

In different lots, the same or different workpieces may be processed. In addition, the number of workpieces to be processed in each lot may be the same or different. The information on the type and the number of workpieces in each lot is included in a processing plan of the processing device 205 which is created by the scheduler 202.

A processing device controller (energy consumption managing unit) 206 connected to each processing device 205 detects energy consumption of a corresponding processing device 205 for each lot. Energy consumption of each processing device 205 detected in each processing device controller 206 is sent to and collected in the manufacturing optimization device 204 for each lot. The manufacturing optimization device 204 obtains information on the energy consumption of each processing device managed by each processing device controller 206 and a result of processing by the scheduler 202 and the dispatcher 203. Based on this, the manufacturing optimization device 204 determines for each lot whether or not each processing device processes the workpiece, in such a manner that the total amount of energy consumption in the plurality of processing devices does not exceed the predetermined maximum of energy consumption. Further, the manufacturing optimization device 204 individually adjusts a processing timing of each processing device operated in each lot, in such a manner that the total amount of energy consumption in the plurality of processing devices during a process of each lot does not exceed the maximum of energy consumption. That is, the manufacturing optimization device 204 manages the lot information, the type of a processing device in each lot, and the timing at which each processing device is operated in each lot.

Figure 15:
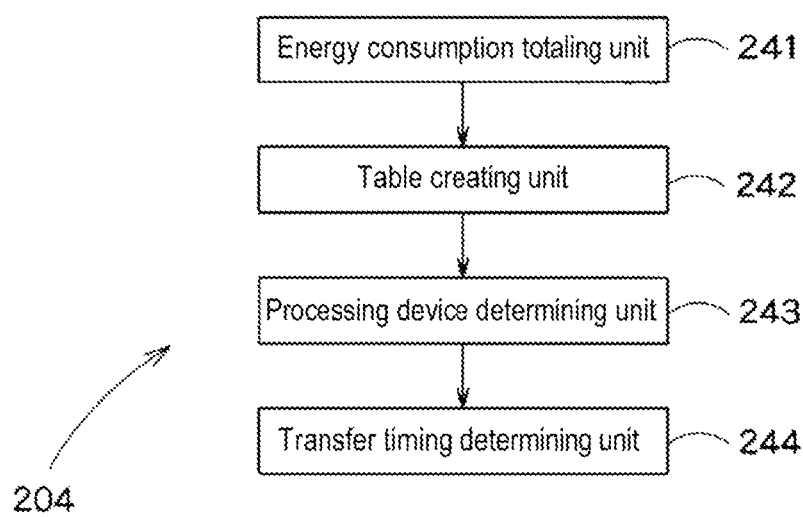
FIG. 15 is a block diagram illustrating an internal configuration of a manufacturing optimization device according to a third embodiment.

FIG. 15 is a block diagram illustrating an internal configuration of the manufacturing optimization device 204 according to the third embodiment. The manufacturing optimization device 204 of FIG. 15 includes an energy consumption totaling unit 241 for totaling energy consumption provided from each processing device controller 206, a table creating unit 242 for tabulating the total amount of energy consumption for each lot, a processing device determining unit 243 for determining a processing device 205 to process the next lot, and a transfer timing determining unit 244 for determining a timing at which a workpiece is transferred up to each processing device 205 which is determined for processing the workpiece.

Based on a result of the process by the scheduler 202 and the dispatcher 203, the processing device determining unit 243 detects the type and the number of workpieces to be processed in the next lot, obtains the maximum number of processing devices 205 operable within a range that does not exceed the predetermined maximum of energy consumption by referring to the table creating unit 242, and makes sure that the next lot is processed within a given amount of time. In addition, the processing device determining unit 243 individually adjusts a processing timing of each processing device operated in each lot, in such a manner that the total amount of energy consumption in the plurality of processing devices during a process of each lot does not exceed the maximum of energy consumption.

Each processing device 205 determined by the processing device determining unit 243 receives a processing instruction at a predetermined timing via the processing device controller 206. In accordance with this, the manufacturing optimization device 204 instructs the transfer control device 208 to transfer workpieces up to each processing device 205, based on the transfer timing determined by the transfer timing determining unit 244.

In the example described above, the total amount of energy consumption in the plurality of processing devices 205 is controlled, such that it does not exceed the predetermined maximum of energy consumption. However, the amount of energy consumed may be additionally controlled when the workpieces are transferred in the transfer device 207, such that the sum of this amount of energy consumption and the total amount of energy consumption in the plurality of processing devices 205 does not exceed the maximum of energy consumption.

In this case, in the table creating unit 242, the amount of energy consumption required for the transfer device 207 to transfer a workpiece by the unit distance may be registered beforehand. The manufacturing optimization device 204 determines a processing device 205 processing a workpiece for each lot and determines a timing at which the workpiece is transferred up to each determined processing device 205. In addition, the manufacturing optimization device 204 controls the sum of the total amount of energy consumption in each determined processing device 205 and the amount of energy consumption required to transfer the workpiece up to each determined processing device 205 not to exceed the maximum of energy consumption.

In more detail, in order to increase the processing efficiency of a lot as much as possible, the transfer timing of the transfer device 207 is scheduled to maximize the number of processing devices 205 processing workpieces belonging to the lot and transfer the workpieces to each processing device 205 in the shortest path. Thus, the as many workpieces as possible can be transferred in the shortest distance, and the processing devices 205 can substantially simultaneously process the plurality of workpieces. Accordingly, it is possible to maximize the production efficiency while limiting the total amount of energy consumption.

In addition, a scheduling may be performed such that the maximum energy consumption is not exceeded by the sum of the amount of energy consumption in the processing device 205 and the transfer device 207 included in the manufacturing optimization system 201 and the amount of energy consumption in other devices.

In this manner, in the third embodiment, the processing schedule of the processing device 205 is created for each lot, such that the amount of energy consumption in the processing device 205 does not exceed the maximum of energy consumption. Thus, it is possible to perform the process for each lot efficiently within the range of the maximum of energy consumption. In addition, in consideration of the amount of energy consumption in the transfer device 207, it is possible to schedule the processing device 205 and the transfer device 207 for each lot, such that the total amount of energy consumption in the manufacturing optimization system 201 does not exceed the maximum of energy consumption.

At least some of the manufacturing optimization system 201 described in the above embodiment may be implemented by either hardware or software. In the latter case, a program implementing at least some functions of the manufacturing optimization system 201 may be stored in a recording medium such as a flexible disk, a CD-ROM or the like and may be read and executed by a computer. The recording medium may be either a removable recording medium such as a magnetic disk, an optical disk or the like, or a fixed recording medium such as a hard disk, a memory or the like.

In addition, the program implementing at least some functions of the manufacturing optimization system 201 may be distributed via a communication link (including wireless communication) such as the Internet. In addition, with this program encoded, modulated or compressed, the program may be distributed via a wired link such as the Internet, a wireless link or through the program stored in a recording medium.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A manufacturing process system comprising:
   a plurality of processing devices which processes workpieces, with respective equipment associated with the plurality of processing devices;
   a transfer device which transfers the workpieces to the plurality of processing devices;
   a host computer which performs a step of creating a transfer plan including information of timings at which the workpieces are carried in and out by the transfer device and a step of acquiring an operation schedule including information of maintenance time from the plurality of processing devices; and a processing device group controller which performs a step of acquiring the transfer plan and the operation schedule from the host computer, a step of comparing the transfer plan and the operation schedule of each processing device, a step of specifying the last process performed in each processing device before maintenance, a step of detecting the end timing of the specified process, and a step of instructing each processing device to be switched to an idle state at the end timing along with the associated equipment.

2. A manufacturing process system comprising:

a plurality of first processing devices which processes workpieces, with respective equipment associated with the plurality of first processing devices;

a plurality of second processing devices which processes workpieces, with respective equipment associated with the plurality of second processing devices;

a transfer device which transfers the workpieces to the plurality of first and second processing devices;

a host computer which performs a step of creating a transfer plan including information of timings at which the workpieces are carried in and out by the transfer device and a step of acquiring an operation schedule including information of maintenance time from the plurality of first and second processing devices;

a first processing device group controller which performs a step of acquiring the transfer plan and the operation schedule of the plurality of first processing devices, a step of comparing the transfer plan and the operation schedule of each first processing device, a step of specifying the last process performed in each first processing device before maintenance, a step of detecting the end timing of the specified process, and a step of instructing each first processing device to be switched to an idle state at the end timing along with the associated equipment;

a second processing device group controller which performs a step of acquiring the transfer plan and the operation schedule of the plurality of second processing devices, a step of comparing the transfer plan and the operation schedule of each second processing device, a step of specifying the last process performed in each second processing device before maintenance, a step of detecting the end timing of the specified process, and a step of instructing each second processing device to be switched to an idle state at the end timing along with the associated equipment; and an upper-level controller which performs a step of acquiring the transfer plan and the operation schedules of the plurality of first and second processing devices from the host computer, a step of transmitting the transfer plan and the operation schedule of the plurality of first processing devices to the first processing device group controller, and a step of transmitting the transfer plan and the operation schedule of the plurality of second processing devices to the second processing device group controller.

3. The manufacturing process system of claim 2, further comprising a common equipment shared by the plurality of first and second processing devices, wherein the upper-level controller performs a step of comparing the transfer plan and the operation schedules of the plurality of first and second processing devices, and a step of instructing the common equipment to be switched to an idle state, based on a result of the comparison.

4. A processing device group control method comprising:

acquiring an operation schedule including information of maintenance time for a plurality of processing devices for processing workpieces, with respective equipment associated with the plurality of processing devices;

acquiring a transfer plan including information of timings at which the workpieces are carried in and out of the plurality of processing devices;

comparing the transfer plan and the operation schedule of each processing device;

specifying the last process performed in each processing device before maintenance;

detecting the end timing of the specified process; and instructing each processing device to be switched to an idle state at the end timing along with the associated equipment.

5. The processing device group control method of claim 4, further comprising:

receiving the transfer plan from a host computer in communication with the plurality of processing devices; and if more than a predetermined time elapses after receiving the latest transfer plan from the host computer, instructing each processing device to be switched to an idle state along with the associated equipment.

6. The processing device group control method of claim 4, further comprising:

receiving the transfer plan and an operation situation of each processing device from a host computer connected in communication with the plurality of processing devices; and if more than a predetermined time elapses after receiving the latest transfer plan from the host computer, performing a step of specifying a processing device to be switched to an idle state, based on a past operation situation of each processing device, and a step of instructing the specified processing device to be switched to an idle state along with the associated equipment.

7. A non-transitory computer readable storage medium for storing therein a computer program for a computer to execute a manufacturing optimization method, the method comprising:

based on a manufacturing plan of a processing device which arbitrarily selects a standby mode consuming energy to allow a process of workpieces to be quickly started and a sleep mode consuming minimal energy to allow the sleep mode to be quickly transitioned to the standby mode and then processes the workpieces, measuring a time interval until the next process is started after the processing device completes the process of the workpieces;

setting the processing device to the sleep mode if the time interval measured exceeds a predetermined base time, and setting the processing device to the standby mode if the time interval does not exceed the predetermined base time; and setting a timing at which the sleep mode is transitioned to the standby mode, in consideration of a warming period required until the processing device returned from the sleep mode to the standby mode starts a process.

8. A manufacturing optimization method comprising:

based on a manufacturing plan of a processing device which arbitrarily selects a standby mode consuming energy to allow a process of workpieces to be quickly started and a sleep mode consuming minimal energy to allow the sleep mode to be quickly transitioned to the standby mode and then processes the workpieces, measuring a time interval until the next process is started after the processing device completes the process of the workpieces;

setting the processing device to the sleep mode if the time interval measured exceeds a predetermined base time, and setting the processing device to the standby mode if the time interval does not exceed the predetermined base time; and setting a timing at which the sleep mode is transitioned to the standby mode, in consideration of a warming period required until the processing device returned from the sleep mode to the standby mode starts a process.

9. The manufacturing optimization method of claim 8, further comprising:

detecting, by the processing device, environmental conditions required to process the workpieces; and determining whether the processing device returned from the sleep mode to the standby mode is ready to start the process of the workpieces, based on a result of the detection by the processing device.

10. The manufacturing optimization method of claim 8, further comprising: setting the processing device to the sleep mode or the standby mode, based on a length of the time interval measured and contents of the process performed for the workpieces by the processing device.

11. A manufacturing optimization system comprising:

a scheduler which creates a manufacturing plan for workpieces;

a dispatcher which makes an operation instruction for a plurality of processing devices to perform a process of the workpieces, based on the manufacturing plan;

a plurality of energy consumption managing units which are respectively provided for the plurality of processing devices and manage energy consumption of the respective processing devices; and a manufacturing optimization device which, based on the energy consumption of each processing device managed in each of the energy consumption managing units and a result of the process by the scheduler and the dispatcher, determines for each lot whether each of the plurality of processing devices processes the workpieces in such a manner that the total amount of energy consumption in the plurality of processing devices does not exceed the predetermined maximum of energy consumption, and individually adjusts a processing timing of each processing device operated in each lot in such a manner that the total amount of energy consumption in the plurality of processing devices during a process of each lot does not exceed the maximum of energy consumption.

12. The manufacturing optimization system of claim 11, wherein the plurality of processing devices is divided into a plurality of groups performing different processes with each other, each group including one or more processing devices performing the same process for the workpieces, and wherein the manufacturing optimization device determines the type and the number of processing devices performing a process simultaneously in each group, and individually adjusts a processing timing of each processing device operated in each lot.

13. The manufacturing optimization system of claim 11, wherein, based on the type and the number of the workpieces to be processed in each lot, the manufacturing optimization device determines for each lot whether each of the plurality of processing devices processes the workpieces, and individually adjusts a processing timing of each processing device operated in each lot.

14. The manufacturing optimization system of claim 11, wherein the manufacturing optimization device includes:

an energy consumption totaling unit which totals energy consumption of the plurality of processing devices processing the workpieces;

a table creating unit which tabulates the total amount of energy consumption for each lot when the type and the number of processing devices operated for each lot are varied;

a processing device determining unit which, based on a processing plan of the plurality of processing devices, performs a step of detecting the type and the number of workpieces to be processed in each lot, and a step of determining for each lot whether each of the plurality of processing devices processes the workpieces, in such a manner that the total amount of energy consumption for each lot does not exceed the predetermined maximum of energy consumption, by referring to a table created in the table creating unit; and a transfer timing determining unit which determines a transfer timing of a transfer device transferring the workpieces up to each processing device being determined to process the workpieces.

15. The manufacturing optimization system of claim 14, wherein the processing device determining unit controls the sum of the total amount of energy consumption for each lot and an amount of energy consumption in the transfer device transferring the workpieces up to the processing device being determined to process the workpieces not to exceed the maximum of energy consumption.

* * * * *